United States Patent [19]

Yasui et al.

[11] 4,278,971
[45] Jul. 14, 1981

[54] ELECTRIC CONTROL CIRCUIT FOR SAFETY APPARATUS IN AUTOMOTIVE VEHICLES

[75] Inventors: Toshio Yasui, Obu; Motoharu Naito, Okazaki, both of Japan

[73] Assignee: Nippondenso Co., Ltd., Kariya, Japan

[21] Appl. No.: 938,876

[22] Filed: Sep. 1, 1978

[30] Foreign Application Priority Data

Sep. 6, 1977 [JP] Japan .............................. 52-106906

[51] Int. Cl.³ .................................................. G08B 21/00
[52] U.S. Cl. ............................... 340/635; 324/60 C; 340/52 H; 340/647; 340/653; 340/661
[58] Field of Search ............ 340/657, 635, 647, 653, 340/661, 530, 52 D, 52 H; 324/60 R, 60 CD, 60 C

[56] References Cited

U.S. PATENT DOCUMENTS

| | | | |
|---|---|---|---|
| 1,757,659 | 5/1930 | Edenburg | 324/60 C |
| 2,455,543 | 12/1948 | Williams | 324/60 C |
| 2,617,859 | 11/1952 | Kraft | 324/60 C |
| 2,789,196 | 4/1957 | Minchenko et al. | 324/60 R X |
| 3,508,146 | 4/1970 | Jackson | 324/60 R |
| 3,622,974 | 11/1971 | Best et al. | 340/52 H X |
| 3,629,816 | 12/1971 | Gillund | 340/52 H X |
| 3,633,159 | 1/1972 | Dillman et al. | 340/52 H |
| 3,657,602 | 4/1972 | Boehm et al. | 346/635 X |
| 3,855,527 | 12/1974 | Masopust, Jr. | 324/60 C |
| 4,166,974 | 9/1979 | Vermeers | 324/60 CD |

*Primary Examiner*—John W. Caldwell, Sr.
*Assistant Examiner*—Daniel Myer
*Attorney, Agent, or Firm*—Cushman, Darby & Cushman

[57] ABSTRACT

An electric control circuit for a safety apparatus adapted to be actuated by electrically operated actuator, the control circuit including an electric power source, a first storage condenser connected with the power source through a resistor to be charged in a predetermined time constant, a normally open switch interposed between the condenser and actuator to discharge the condenser through the actuator upon closure of the switch, a second storage condenser connected with the power source through a second resistor to be charged in a second predetermined time constant, the first-named time constant being normally larger than the second time constant, a comparator for comparing a first signal indicating the charged voltage of the first condenser with a second signal indicating the charged voltage of the second condenser to generate an output signal therefrom when the first-named time constant becomes smaller than the second time constant, and an indicator for indicating shortage of the charged voltage of the first condenser when received the output signal from the comparator.

5 Claims, 2 Drawing Figures

ELECTRIC CONTROL CIRCUIT FOR SAFETY APPARATUS IN AUTOMOTIVE VEHICLES

BACKGROUND OF THE INVENTION

The present invention relates to an electric control circuit for actuating a safety apparatus of automotive vehicles, and more particularly to an electric control circuit of the type in which a storage condenser is provided to ensure supply of electric energy to the control circuit even when electric energy from the primary electric power source is unavailable due to disconnection of conductors for the control circuit.

In such an electric control circuit as noted above, an alminum electrolytic condenser of a large capacitance is utilized as the storage condenser to activate the control circuit. It is, however, observed that for a long period of time, the capacitance value of the condenser is inevitably decreased due to leakage of electrolyte, high ambient temperature or the like. If the defective condenser is not replaced with a new one, the electric control circuit may not be activated to actuate the safety apparatus.

SUMMARY OF THE INVENTION

It is, therefore, the primary object of the present invention to provide an electric control circuit in which the capacitance value of the storage condenser is detected prior to start of the vehicle, thereby warning necessity of replacement of the defective condenser.

In a preferred embodiment of the present invention, the primary object is accomplished by providing an electric control circuit for a safety apparatus adapted to be actuated by electrically operated actuator, the control circuit comprising an electric power source, a storage condenser connected with the power source through a resistor to store electric energy in a predetermined time constant, normally open switch means interposed between the storage condenser and the actuator to discharge the storage condenser through the actuator upon closure of the switch means, a second storage means connected with the power source through a second resistor to store electric energy in a second predetermined time constant, the first-named time constant being normally larger than the second time constant, a comparator for comparing a first signal indicative of the stored electric energy of the storage condenser with a second signal indicative of the stored electric energy of the second storage means to generate an output signal therefrom when the first-named time constant becomes smaller than the second time constant, and means for informing of shortage of the stored electric energy of the storage condenser when received the output signal from the comparator.

BRIEF DESCRIPTION OF THE DRAWINGS

Additional objects and advantages of the present invention will be more readily apparent from the following detailed description of a preferred embodiment thereof when taken together with the accompanying drawings in which.

DESCRIPTION OF THE PREFERRED EMBODIMENT

Figure 1:
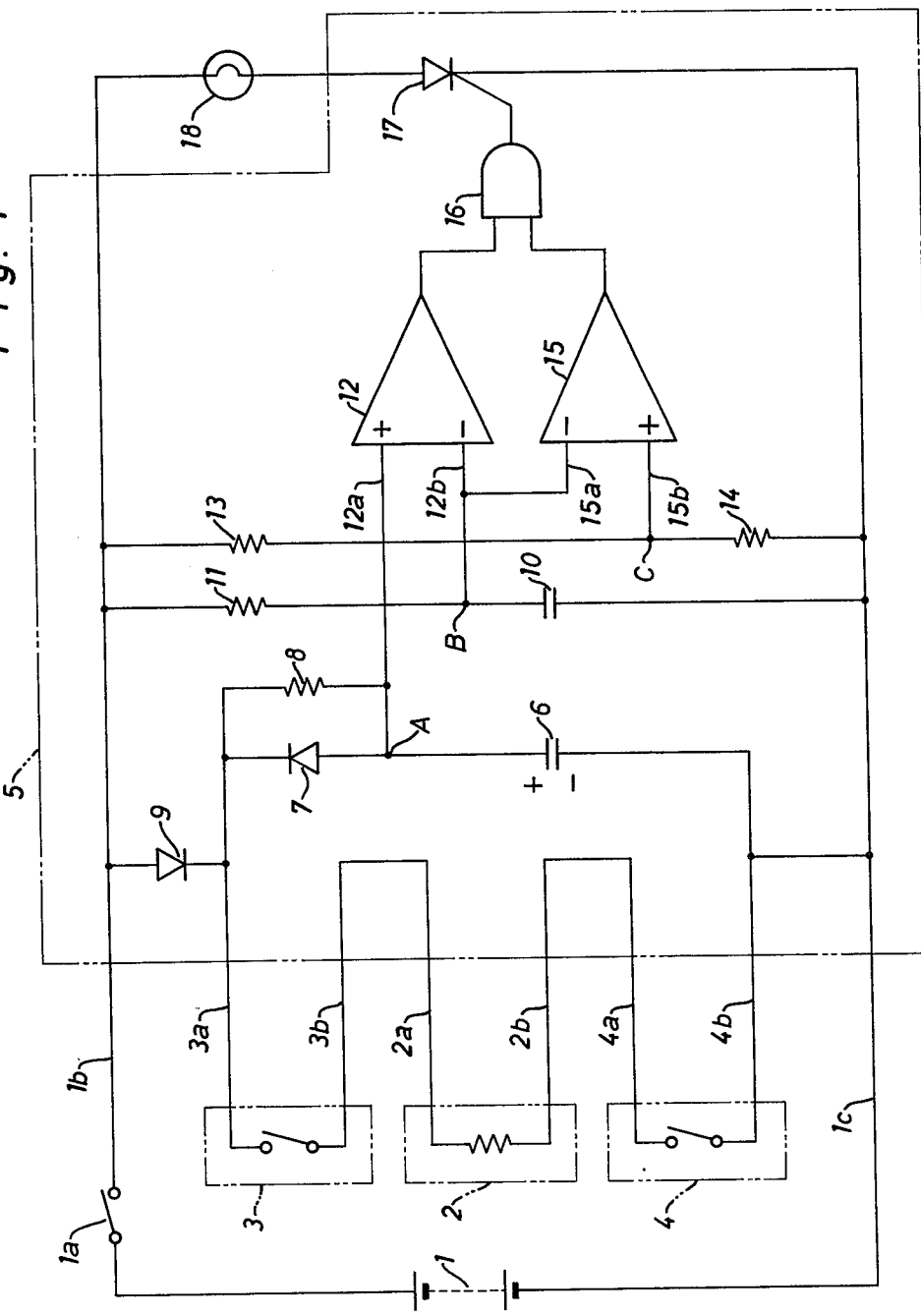
FIG. 1 is a schematic diagram of an electric control circuit in accordance with the present invention.

Now referring to FIG. 1 of the accompanying drawings, there is illustrated an electric control circuit in accordance with the present invention which is adapted to a safety apparatus for an automotive vehicle. The safety apparatus includes a conventional primer 2 to be fired electrically to supply fluid under pressure into an inflatable air bag. The electric control circuit comprises a primary electric power source in the form of a vehicle battery 1 and a pair of collision sensors 3, 4 in series with each other through the primer 2. The collision sensors 3, 4 are respectively in the form of a normally open switch and are mounted on a front bumper of the vehicle and a central portion of the vehicle chassis respectively. The collision sensor 3 is connected at its one end to the cathode of diode 9 whose anode is connected to a plus terminal of the battery 1 through a conductor 1b and an ignition switch 1a, and the collision sensor 4 is connected at its one end to a minus terminal of the battery 1 through a conductor 1c. Thus, the collision sensors 3, 4 are adapted to be closed in response to an occurrence of vehicle collision to fire the primer 2.

The electric control circuit further comprises a storage condenser 6 having one end connected in series with the collision sensor 3 through a diode 7 and the other end connected to the minus terminal of battery 1 through the conductor 1c. The storage condenser 6 is in the form of an aluminum electrolytic condenser of a large capacitance value $C_1$ (for instance, $10^3 - 6 \times 10^3 \mu F$) and is connected in series with a resistor 8 to provide a predetermined time constant $R_1C_1$, the character $R_1$ indicating a resistance value of the resistor 8. The resistor 8 is in parallel with the diode 7 and is connected in series with the cathode of diode 9. When the ignition switch 1a is closed, the storage condenser 6 is charged through the diode 9 and resistor 8 in the predetermined time constant $R_1C_1$, as shown by a solid curve A in FIG. 2. If one of the conductors 1b, 1c is disconnected in an occurrence of vehicle collision, the storage condenser 6 is effectively discharged through the diode 7 upon closure of the sensor switches 3, 4 to energize the primer 2. From the above description, it will be noted that the storage condenser 6 acts as a secondary electric power source for the primer 2.

The storage condenser 6 is also connected at point A to the first input terminal 12a of a first comparator 12 whose second input terminal 12b is connected at point B to a second storage condenser 10. The second storage condenser 10 is in the form of a tantalum electrolytic condenser of a small capacitance value $C_2$ (for instance, 10–60 $\mu F$.) and is connected in series with a resistor 11 to provide a reference time constant $R_2C_2$, the character $R_2$ indicating a resistance value of the resistor 11. When the ignition switch 1a is closed, the condenser 10 is charged through the resistor 11 in the reference time constant $R_2C_2$, as shown by a solid curve B in FIG. 2. This applies a reference voltage to the second input terminal 12b of the first comparator 12.

Figure 2:
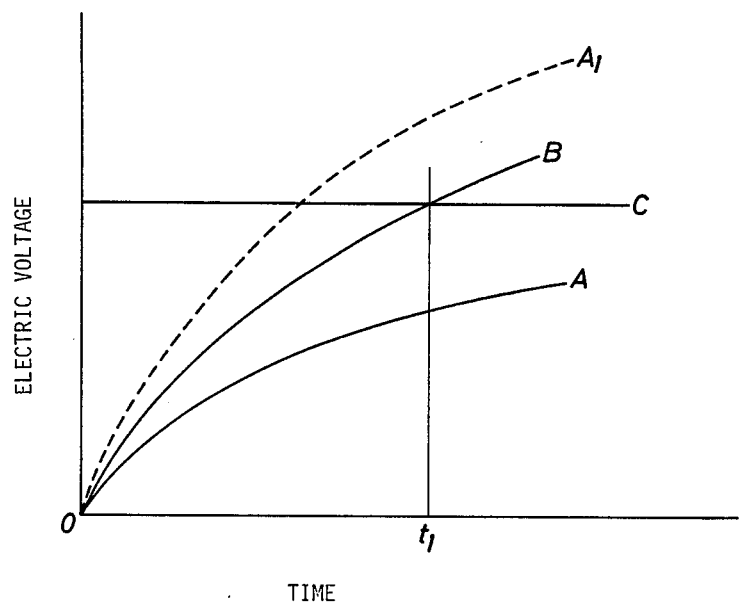
FIG. 2 is a graph illustrating charged voltages in relation to a period of time.

Taking into consideration with the above-noted capacitance values of condensers 6, 10, it will be understood that the predetermined time constant $R_1C_1$ is normally larger than the reference time constant $R_2C_2$. This means that the charging rate of condenser 10 is larger than that of condenser 6, as shown in FIG. 2. If the capacitance value $C_1$ of condenser 6 decreases due to leakage of electrolyte, rises of ambient temperature or the like, the predetermined time constant $R_1C_1$ becomes smaller than the reference time constant $R_2C_2$. Then, the charging rate of condenser 6 becomes larger than that of condenser 10, as shown by broken lines $A_1$ in FIG. 2, and the charged voltage of condenser 6 becomes higher than the reference voltage. On the other hand, it is noted that the tantalum electrolytic condenser 10 has high reliability to maintain the initial capacitance value $C_2$ for a long period of time regardless of rises of ambient temperature or the like.

Thus, the first comparator 12 receives at its first input terminal 12a a first signal indicative of the charged voltage of condenser 6 and at its second input terminal 12b a second signal indicative of the reference voltge. While the charged voltage of condenser 6 is maintained lower than the reference voltage, the comparator 12 generates a low level signal therefrom. If the charged voltage of condenser 6 becomes higher than the reference voltage, the comparator 12 generates a high level signal therefrom. A pair of resistors 13, 14 forms a voltage divider which is connected in parallel with the second storage condenser 10 and resistor 11 to generate at its output terminal C a divided constant voltage as shown by a horizontal solid line C in FIG. 2. A second comparator 15 has a first input terminal 15a connected at point B to the second storage condenser 10 and a second input terminal 15b connected at point C to the voltage divider. While the reference voltage is maintained lower than the divided constant voltage, the second comparator 15 generates a high level signal therefrom. When the reference voltage becomes higher than the divided voltage, the comparator 15 generates a low level signal therefrom.

An AND gate 16 has first and second input terminals respectively connected to the output terminals of the first and second comparators 12, 15. The AND gate 16 generates a high level signal therefrom when received a high level signal from each of the comparators 12, 15, and it generates a low level signal therefrom when received a low level signal from one of the comparators 12, 15. This means that the high level signal from AND gate 16 is maintained in accordance with the high level signal from the first comparator 12 as long as the high level signal from the second comparator 15 is maintained. In FIG. 2, a crossing point of the solid curve B and the solid line C indicates a period of time $t_1$ which is determined by the high level signal from the second comparator 15. In this embodiment, the period of time $t_1$ is determined in about 0.5 seconds after closure of the ignition switch 1a to prevent erroneous operation caused by various noises.

A silicon controlled rectifier or SCR 17 has a gate for receiving the low or high level signal from AND gate 16 and is connected in series with an indication lamp 18. SCR 17 is turned on in response to the high level signal from AND gate 16 and is maintained in its conductive state until opening the ignition switch 1a. The indication lamp 18 is provided within the vehicle compartment and supplied with electric energy from the battery 1 upon conduction of SCR 17 to inform the operator of decrease of the capacitance value of condenser 6. Furthermore, in an actual practice of the embodiment, the whole component elements enclosed by an imaginary line 5 in FIG. 1 are assembled within a sealed case (not shown) to protect the component elements from damages in an occurrence of vehicle collision.

The mode of operation of the embodiment will now be described in detail in relation to changes of the capacitance value of condenser 6. When the ignition switch 1a is closed to start the vehicle, the storaged condenser 6 is charged through the diode 9 and resistor 8, as shown by the solid curve A in FIG. 2, the second storage condenser 10 is also charged through the resistor 11, as shown by the solid curve B in FIG. 2, and the voltage divider generates at point C the divided constant voltage. Then, the first comparator 12 receives at its first input terminal 12a the charged voltage of condenser 6 and at its second input terminal 12b the reference voltage appearing at point B. Simultaneously, the second comparator 15 receives at its first input terminal 15a the reference voltage and at its second input terminal 15b the divided constant voltage.

In case the storage condenser 6 has the initial capacitance value, the charged voltage of condenser 6 is maintained lower than the reference voltage, and the reference voltage is maintained lower than the divided constant voltage during the period of time $t_1$. Then, the first comparator 12 generates a low level signal therefrom and the second comparator 15 generates a high level signal therefrom. As a result, the AND gate 16 generates a low level signal therefrom to retain SCR 17 nonconductive. Thus, the indication lamp 18 may not be lit to inform the operator of normality of the storage condenser 6 prior to start of the vehicle. After lapse of the period of time $t_1$, a low level signal is generated from the comparator 15 to continuously maintain the low level signal from AND gate 16. This inhibits conduction of SCR 17 to prevent erroneous lighting of the lamp 18. Under such a condition, when the sensor switches 3, 4 are closed in response to an occurrence of vehicle collision, the primer 2 is energized by electric energy supplied through the diode 9 from the power source 1. If one of the conductors 1b, 1c is disconnected, the storage condenser 6 is discharged through the diode 7 to energize the primer 2. Additionally, when the ignition switch 1a is opened after travel of the vehicle without any collision, the charged voltage of condenser 6 is discharged through the electric control circuit.

In case the capacitance value of condenser 6 decreases due to leakage of electrolyte, rises of ambient temperature or the like, the charged voltage of condenser 6 becomes higher than the reference voltage, as shown by the broken lines $A_1$ in FIG. 2. Then, the first comparator 12 generates a high level signal therefrom during the period of time $t_1$ defined by the high level signal from the second comparator 15. As a result, the AND gate 16 generates a high level signal therefrom to make SCR 17 conductive. Thus, the indication lamp 18 is lit to inform the operator of decrease of the capacitance value of condenser 6 prior to start of the vehicle so that the defective condenser 6 is replaced with a new one to ensure normal operation of the electric control circuit.

In a modification of the present invention, the second condenser 10 may be replaced with an electromagnetic coil having the same time constant as the reference time constant $R_2C_2$, and a timing circuit may be provided in stead of the voltage divider and second comparator 15 to define the period of time $t_1$ noted above. It is also noted that the present invention may be adapted to various kinds of safety apparatuses for automotive vehicles, in which the ignition switch 1a may be replaced with a main switch for the prime safety apparatus.

Although a certain specific embodiment of the present invention has been shown and described, it is obvious that many modifications and variations thereof are possible in light of these teachings. It is to be understood therefore that within the scope of the appended claims, the invention may be practiced otherwise than as specifically described herein.

What is claimed is:

1. In an electric control circuit for a safety apparatus adapted to be actuated by electrically operated actuator means, said control circuit including an electric power source, a storage condenser connected with said power source through a resistor to store electric energy in a predetermined time constant, and normally open switch means interposed between said condenser and said actuator means to discharge said condenser through said actuator means upon closure of said switch means, the improvement comprising:
second storage means connected with said power source through a second resistor for storing electric energy in a second predetermined time constant, the first-named time constant being normally larger than the second time constant;
a comparator for comparing a first signal indicative of the stored electric energy of said first storage condenser with a second signal indicative of the stored electric energy of said second storage means to generate an output signal therefrom when the first-named time constant becomes smaller than the second time constant; and
means for informing of shortage of the stored electric energy of said first storage condenser when received the output signal from said comparator.

2. An electric control circuit for a safety apparatus as claimed in claim 1, wherein said storage condenser is an aluminum electrolytic condenser, and said second storage means is a tantalum electrolytic condenser.

3. An electric control circuit for a safety apparatus as claimed in claim 1, further comprising a signal generator for continuously generating an output signal therefrom until the stored electric energy of said second storage means reaches a predetermined value; and
means for applying the output signal from said comparator to said informing means during a period of time defined by the output signal from said signal generator.

4. An electric control circuit for a safety apparatus as claimed in claim 3, wherein said signal generator comprises:
a constant voltage generator connected in parallel with said second storage means and said second resistor to generate therefrom an output signal indicative of a constant voltage; and
a second comparator for comparing the second signal indicative of the stored electric energy of said second storage means with the output signal of said constant voltage generator to continuously generate an output signal therefrom until the stored electric energy of said second storage means reaches a value of the constant voltage, the said period of time being defined by the output signal from said second comparator.

5. An electric control circuit for a safety apparatus as claimed in claim 4, wherein said means for applying the output signal from said first-named comparator to said informing means is an AND element connected to each output terminal of said first-named and second comparators for applying the output signal from said first-named comparator to said informing means by receiving the output signals from said first-named and second comparators.

* * * * *